(12) United States Patent
Tahara et al.

(10) Patent No.: US 12,273,080 B2
(45) Date of Patent: Apr. 8, 2025

(54) RADIO-FREQUENCY CIRCUIT AND COMMUNICATION DEVICE

(71) Applicant: Murata Manufacturing Co., Ltd., Kyoto (JP)

(72) Inventors: Kenji Tahara, Kyoto (JP); Syunji Yoshimi, Kyoto (JP); Kazuhiro Ikarashi, Kyoto (JP); Yusuke Tanaka, Kyoto (JP); Kenichi Shimamoto, Kyoto (JP); Masatoshi Hase, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 426 days.

(21) Appl. No.: 17/817,018

(22) Filed: Aug. 3, 2022

(65) Prior Publication Data

US 2022/0376665 A1 Nov. 24, 2022

Related U.S. Application Data

(63) Continuation of application No. PCT/JP2020/042649, filed on Nov. 16, 2020.

(51) Int. Cl.
*H03F 3/24* (2006.01)
*H03F 1/56* (2006.01)
*H04B 1/04* (2006.01)

(52) U.S. Cl.
CPC .............. *H03F 3/245* (2013.01); *H03F 1/56* (2013.01); *H04B 1/04* (2013.01);
(Continued)

(58) Field of Classification Search
CPC . H03F 3/245; H03F 1/56; H03F 1/565; H03F 2200/171; H03F 2200/387; H03F 2200/451; H04B 1/04; H04B 2001/0408
See application file for complete search history.

(56) References Cited

U.S. PATENT DOCUMENTS

2008/0284539 A1 11/2008 Tateoka et al.
2009/0085666 A1 4/2009 Ohnishi et al.
(Continued)

FOREIGN PATENT DOCUMENTS

JP 2008-288769 A 11/2008
JP 2009-88770 A 4/2009
(Continued)

OTHER PUBLICATIONS

International Search Report for PCT/JP2020/042649 dated Jan. 12, 2021.

*Primary Examiner* — Keith Ferguson
(74) *Attorney, Agent, or Firm* — MCDONALD HOPKINS LLC

(57) ABSTRACT

The present disclosure facilitates impedance matching between a power amplifier and filters. A radio-frequency circuit includes a power amplifier, a plurality of transmit filters, a switch, a plurality of first matching networks, and a second matching network. The switch switches the plurality of transmit filters to be coupled to the power amplifier. The plurality of first matching networks are coupled between the plurality of transmit filters and the switch. The second matching network is coupled between the power amplifier and the switch. The second matching network includes a transmission line transformer.

20 Claims, 9 Drawing Sheets

(52) U.S. Cl.
CPC .. *H03F 2200/171* (2013.01); *H03F 2200/387* (2013.01); *H03F 2200/451* (2013.01)

(56) References Cited

U.S. PATENT DOCUMENTS

| | | | |
|---|---|---|---|
| 2012/0087282 A1 | 4/2012 | Shibahara | |
| 2016/0248384 A1* | 8/2016 | Lehtola | H03F 1/0211 |
| 2018/0069574 A1 | 3/2018 | Kondo | |
| 2019/0334486 A1 | 10/2019 | Tsuchida | |
| 2020/0228086 A1 | 7/2020 | Akiyama | |

FOREIGN PATENT DOCUMENTS

| | | |
|---|---|---|
| JP | 2018-42100 A | 3/2018 |
| JP | 2018-186372 A | 11/2018 |
| JP | 2019-193115 A | 10/2019 |
| WO | 2011/001769 A1 | 1/2011 |
| WO | 2019/082551 A1 | 5/2019 |

* cited by examiner

RADIO-FREQUENCY CIRCUIT AND COMMUNICATION DEVICE

CROSS REFERENCE TO RELATED APPLICATION

This is a continuation of International Application No. PCT/JP2020/042649 filed on Nov. 16, 2020 which claims priority from Japanese Patent Application No. 2020-043531 filed on Mar. 12, 2020. The contents of these applications are incorporated herein by reference in their entireties.

BACKGROUND ART

Technical Field

The present disclosure generally relates to radio-frequency circuits and communication devices and more particularly relates to a radio-frequency circuit including a power amplifier and a communication device including the radio-frequency circuit.

There are known radio-frequency front-end circuits (radio-frequency circuits) including a power amplifier (refer to, for example, Patent Document 1).

The radio-frequency front-end circuit described in Patent Document 1 includes transmit amplifier circuits (power amplifiers), duplexers (including transmit filters), and output matching circuits. Each output matching circuit is disposed between the output terminal of a corresponding transmit amplifier circuit and the input terminal of a corresponding transmit filter, and the output matching circuit matches the impedance between the transmit amplifier circuit and the transmit filter.

Patent Document 1: Japanese Unexamined Patent Application Publication No. 2019-193115

BRIEF SUMMARY

The known radio-frequency circuit described in Patent Document 1, however, has a problem in which the impedance matching between the power amplifier and the transmit filter is not easy.

The present disclosure provides a radio-frequency circuit and a communication device that have a capability of easily matching the impedance between a power amplifier and transmit filters.

A radio-frequency circuit according to an aspect of the present disclosure includes a power amplifier, a plurality of transmit filters, a switch, a plurality of first matching networks, and a second matching network. The switch switches the plurality of transmit filters to be coupled to the power amplifier. The plurality of first matching networks are coupled between the plurality of transmit filters and the switch. The second matching network is coupled between the power amplifier and the switch. The second matching network includes a transmission line transformer.

A communication device according to an aspect of the present disclosure includes the radio-frequency circuit and a signal processing circuit. The signal processing circuit processes a radio-frequency signal to be transmitted to the radio-frequency circuit.

With the radio-frequency circuit and the communication device according to the above aspects of the present disclosure, impedance can be easily matched between the power amplifier and the filters.

DETAILED DESCRIPTION

Figure 1:
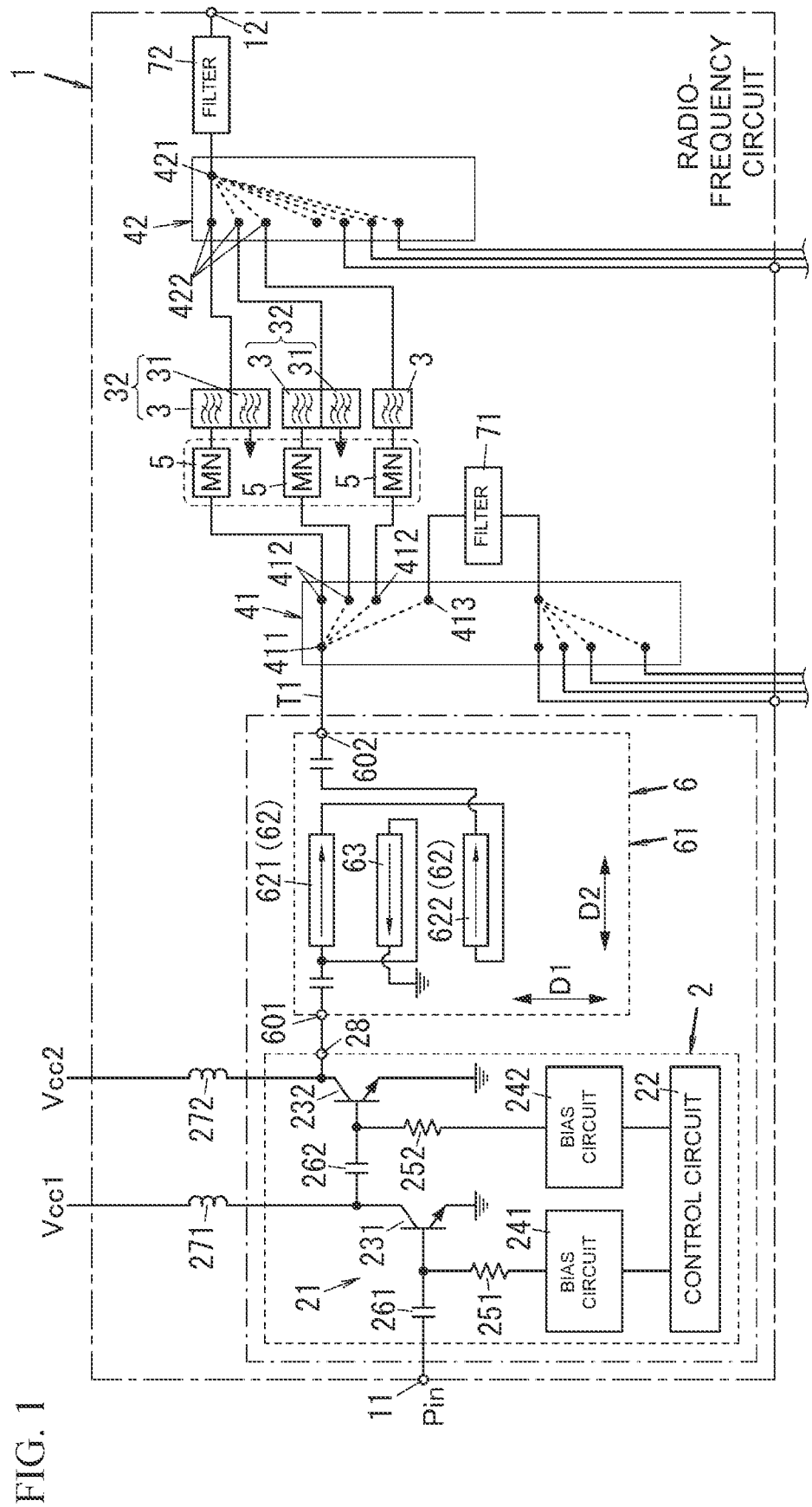
FIG. 1 is a schematic diagram illustrating a configuration of a radio-frequency circuit according to a first embodiment.

Hereinafter, radio-frequency circuits and communication devices according to first to sixth embodiments will be described with reference to the drawings. FIGS. 4 and 6 to 10 referred to in the following first to sixth embodiments are all schematic drawings, and the proportion of size and thickness of each constituent element in the drawings is not necessarily equal to the corresponding proportion in actual measurements.

First Embodiment (1) Radio-Frequency Circuit

The following describes a radio-frequency circuit 1 according to a first embodiment with reference to drawings.

The radio-frequency circuit 1 according to the first embodiment includes, as illustrated in FIG. 1, a power amplifier 2, a plurality (three in the example in the drawing) of transmit filters 3, a first switch 41, a second switch 42, a plurality (three in the example in the drawing) of first matching networks 5, and a second matching network 6. The radio-frequency circuit 1 further includes a plurality (two in the example in the drawing) of filters 71 and 72, an input terminal 11, and an antenna terminal 12. A radio-frequency signal outputted from the radio-frequency circuit 1 is transmitted through an antenna 91 (refer to FIG. 2) described later to a base station (not illustrated in the drawing). The radio-frequency circuit 1 can be used as a radio-frequency module in devices such as a communication device 9 (refer to FIG. 2) described below.

(2) Communication Device

The following describes the communication device 9 using the radio-frequency circuit 1 with reference to drawings.

Figure 2:
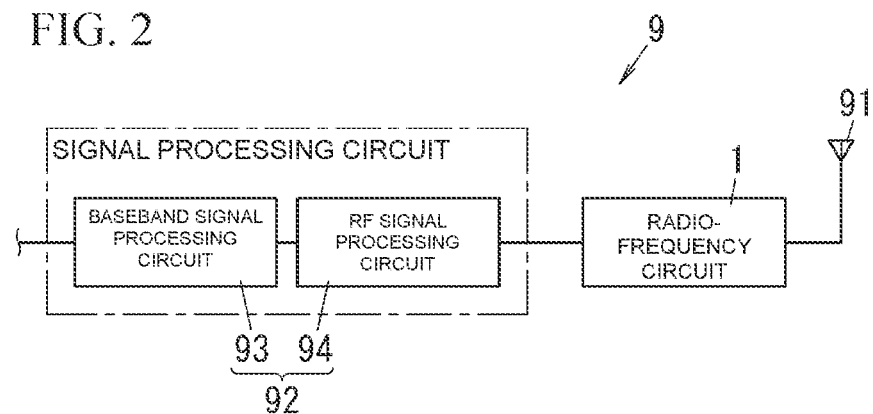
FIG. 2 is a block diagram illustrating a configuration of a communication device according to the embodiment.

As illustrated in FIG. 2, the communication device 9 includes the radio-frequency circuit 1, the antenna 91, a signal processing circuit 92, and a power supply circuit (not illustrated in the drawing).

(2.1) Antenna

As illustrated in FIG. 2, the antenna 91 is coupled to the antenna terminal 12 (refer to FIG. 1) of the radio-frequency circuit 1. The antenna 91 has a function of emitting in the form of a radio wave a radio-frequency signal (transmit signal) outputted from the radio-frequency circuit 1 and a function of receiving in the form of a radio wave a radio-frequency signal (receive signal) from outside and outputting the radio-frequency signal to the radio-frequency circuit 1.

(2.2) Signal Processing Circuit

As illustrated in FIG. 2, the signal processing circuit 92 includes a baseband signal processing circuit 93 and a radio-frequency (RF) signal processing circuit 94. The signal processing circuit 92 processes a radio-frequency signal to be transmitted to the radio-frequency circuit 1. The signal processing circuit 92 outputs a radio-frequency signal to a transmit circuit 21 (refer to FIG. 1).

The baseband signal processing circuit 93, which may be, for example, a baseband integrated circuit (BBIC), processes a radio-frequency signal. The frequency of the radio-frequency signal may range, for example, from about several hundreds of MHz to about several GHz.

The baseband signal processing circuit 93 generates an in-phase signal and a quadrature signal from a baseband signal. The baseband signal may be, for example, a sound signal or image signal inputted from outside. The baseband signal processing circuit 93 performs IQ modulation by adding an in-phase signal and a quadrature signal together and outputs a transmit signal. At this time, the transmit signal is a modulated signal (IQ signal) generated by amplitude modulating a carrier wave signal of a given frequency by a period longer than the period of the carrier wave signal. The baseband signal processing circuit 93 outputs the modulated signal as an IQ signal. The IQ signal is a signal of an amplitude and phase in the IQ plane. The frequency of the IQ signal may range, for example, from about several MHz to about several tens of MHz.

The RF signal processing circuit 94, which may be, for example, a radio frequency integrated circuit (RFIC), processes a radio-frequency signal. The RF signal processing circuit 94 performs a predetermined signal processing operation on, for example, the modulated signal (IQ signal) outputted from the baseband signal processing circuit 93. Specifically, the RF signal processing circuit 94 processes by, for example, upconversion the modulated signal outputted by the baseband signal processing circuit 93 and outputs the processed radio-frequency signal to the radio-frequency circuit 1. The RF signal processing circuit 94 does not necessarily perform direct conversion from a modulated signal to a radio-frequency signal. The RF signal processing circuit 94 may convert a modulated signal into an intermediate-frequency (IF) signal and generate a radio-frequency signal from the converted IF signal.

The signal processing circuit 92 outputs a power supply control signal to the power supply circuit (not illustrated in the drawing). The power supply control signal contains information about changes in amplitude of radio-frequency signal. The power supply control signal is outputted from the signal processing circuit 92 to the power supply circuit to change the amplitude of supply voltages Vcc1 and Vcc2 (refer to FIG. 1). The power supply control signal may be, for example, an in-phase signal and a quadrature signal.

(3) Constituent Elements of Radio-Frequency Circuit

The following describes constituent elements of the radio-frequency circuit 1 according to the first embodiment with reference to drawings.

(3.1) Power Amplifier

As illustrated in FIG. 1, the power amplifier 2 includes the transmit circuit 21 and a control circuit 22. The power amplifier 2 may be configured by, for example, two-stage amplifier circuits. The power amplifier 2 is provided in a transmit path T1. The transmit path T1 connects the input terminal 11 and the antenna terminal 12.

(3.1.1) Transmit Circuit

As illustrated in FIG. 1, the transmit circuit 21 includes a plurality (two in the example in the drawing) of transistors 231 and 232 (amplification elements) and a plurality (two in the example in the drawing) of bias circuits 241 and 242. The transmit circuit 21 includes a plurality (two in the example in the drawing) of resistors 251 and 252 and a plurality (two in the example in the drawing) of capacitors 261 and 262. The transmit circuit 21 may be configured by, for example, an integrated circuit (IC) chip such as a heterojunction bipolar transistor (HBT) chip.

(3.1.2) Transistor

The transistor 231 may be, for example, an NPN transistor as illustrated in FIG. 1. The transistor 231 is an amplification element for amplifying a radio-frequency signal outputted from the RF signal processing circuit 94 (refer to FIG. 2) described later. The base of the transistor 231 is coupled to the input terminal 11. Specifically, the base of the transistor 231 is electrically coupled to the input terminal 11 via the capacitor 261. The collector of the transistor 231 is electrically coupled to an inductor 271. The emitter of the transistor 231 is grounded.

The transistor 231 and the inductor 271 together form a common-emitter circuit for amplifying the radio-frequency signal inputted to the base. The supply voltage Vcc1 is supplied to the common-emitter circuit. A radio-frequency signal is inputted to the base of the transistor 231 via the capacitor 261. The bias circuit 242 is coupled to the base of the transistor 231 via the resistor 251, so that a given bias current is added to the radio-frequency signal. The power supply circuit (not illustrated in the drawing) is coupled to the collector of the transistor 231 via the inductor 271. The power supply circuit supplies to the collector of the transistor 231 the supply voltage Vcc1 controlled in accordance with the amplitude level of the radio-frequency signal. The collector of the transistor 231 is also coupled to the transistor 232 via the capacitor 262.

The transistor 232 may be, for example, an NPN transistor as illustrated in FIG. 1. The transistor 232 is an amplification element for further amplifying the radio-frequency signal amplified by the transistor 231. The base of the transistor 232 is coupled to an output end of the transistor 231. Specifically, the base of the transistor 232 is electrically coupled to the output end of the transistor 231 via the capacitor 262. The collector of the transistor 232 is electrically coupled to an inductor 272. The emitter of the transistor 232 is grounded.

The transistor 232 and the inductor 272 together form a common-emitter circuit for amplifying the radio-frequency signal inputted to the base. The supply voltage Vcc2 is supplied to the common-emitter circuit. The radio-frequency signal outputted from the transistor 231 is inputted to the base of the transistor 232. The bias circuit 242 is coupled to the base of the transistor 232 via the resistor 252, so that a given bias voltage is added to the radio-frequency signal outputted from the transistor 232. The power supply circuit (not illustrated in the drawing) is coupled to the collector of the transistor 232 via the inductor 272. The power supply circuit supplies to the collector of the transistor 232 the supply voltage Vcc2 controlled in accordance with the amplitude level of the radio-frequency signal. The collector of the transistor 232 is also coupled to the second matching network 6.

(3.1.3) Bias Circuit

The bias circuit 241 illustrated in FIG. 1 applies a bias to a radio-frequency signal to establish the operating point of the transistor 231. The bias circuit 241 may be implemented by, for example, a transistor such as an HBT.

The bias circuit 241 is coupled to the base of the transistor 231. Specifically, the bias circuit 241 has an output end coupled between an output end of the capacitor 261 and the base of the transistor 231. More specifically, the output end of the bias circuit 241 is coupled via the resistor 251 to a node between the output end of the capacitor 261 and the base of the transistor 231. The bias circuit 241 is configured to supply a bias (bias current) to the base of the transistor 231.

Although not illustrated in the drawing, a battery voltage supplied from a battery of, for example, the communication device 9 (refer to FIG. 2) including the radio-frequency circuit 1 is applied as a bias voltage to the collector of the transistor implementing the bias circuit 241. The emitter of the transistor implementing the bias circuit 241 is coupled to the base of the transistor 231. The bias circuit 241 is not necessarily configured in the manner described above, and the bias circuit 241 may be configured in any manner when the bias circuit 241 can establish the operating point of the transistor 231 by applying a bias to a radio-frequency signal.

The bias circuit 242 illustrated in FIG. 1 applies a bias to a radio-frequency signal to establish the operating point of the transistor 232. The bias circuit 242 may be implemented by, for example, a transistor such as an HBT.

The bias circuit 242 is coupled to the base of the transistor 232. Specifically, the bias circuit 242 has an output end coupled between an output end of the capacitor 262 and the base of the transistor 232. More specifically, the output end of the bias circuit 242 is coupled via the resistor 252 to a node between the output end of the capacitor 262 and the base of the transistor 232. The bias circuit 242 is configured to supply a bias (bias current) to the base of the transistor 232.

Although not illustrated in the drawing, a battery voltage supplied from a battery of, for example, the communication device 9 (refer to FIG. 2) including the radio-frequency circuit 1 is applied as a bias voltage to the collector of the transistor implementing the bias circuit 242. The emitter of the transistor implementing the bias circuit 242 is coupled to the base of the transistor 232. The bias circuit 242 is not necessarily configured in the manner described above, and the bias circuit 242 may be configured in any manner when the bias circuit 242 can establish the operating point of the transistor 232 by applying a bias to a radio-frequency signal.

(3.1.4) Control Circuit

As illustrated in FIG. 1, the control circuit 22 controls the transmit circuit 21. Specifically, the control circuit 22 separately controls the bias circuits 241 and 242.

(3.2) Transmit Filter

As illustrated in FIG. 1, the transmit filters 3 have communication bands that allow radio-frequency signals to pass. The transmit filters 3 are provided in the transmit path T1. Specifically, the transmit filters 3 are provided between the power amplifier 2 and the antenna terminal 12 in the transmit path T1. More specifically, the transmit filters 3 are provided between the first switch 41 and the second switch 42. The transmit filters 3 pass the radio-frequency signal outputted from the power amplifier 2. The transmit path T1 connects the input terminal 11 and the antenna terminal 12 of the radio-frequency circuit 1 to transmit radio-frequency signals from the antenna 91.

In the example in FIG. 1, two of the transmit filters 3 form duplexers 32 in conjunction with receive filters 31. The transmit filters 3 are not limited to a single transmit filter or the duplexers 32; the transmit filters 3 may form multiplexers composed of three or more filters.

(3.3) First Switch

As illustrated in FIG. 1, the first switch 41 selectively connects the transmit path T1 to the power amplifier 2; in other words, the first switch 41 switches the transmit filters 3 to be coupled to the power amplifier 2.

The first switch 41 has a common terminal 411 and a plurality of selection terminals 412 and 413. The common terminal 411 is coupled to the power amplifier 2. Specifically, the common terminal 411 is coupled to an output end 602 of the second matching network 6. The common terminal 411 is electrically coupled to the power amplifier 2 via the second matching network 6. The selection terminals 412 are in one-to-one correspondence with the transmit filters 3. The selection terminals 412 are respectively coupled to the corresponding transmit filters 3. Specifically, each selection terminal 412 is coupled to an input end of the corresponding first matching network 5. The selection terminals 412 are electrically coupled to the corresponding transmit filters 3 via the first matching networks 5.

The first switch 41 can connect, for example, one of the selection terminals 412 to the common terminal 411. The first switch 41 may be, for example, a switch integrated circuit (IC). The first switch 41 is controlled by, for example, the signal processing circuit 92 (refer to FIG. 2). In accordance with a control signal from the RF signal processing circuit 94 (refer to FIG. 2) of the signal processing circuit 92, the first switch 41 switches connections between the common terminal 411 and the selection terminals 412.

(3.4) Second Switch

As illustrated in FIG. 1, the second switch 42 selectively connects a path to the antenna terminal 12; in other words, the second switch 42 switches the plurality of filters including the transmit filters 3 to be coupled to the antenna terminal 12.

The second switch 42 has a common terminal 421 and a plurality of selection terminals 422. The common terminal 421 is coupled to the antenna terminal 12. Specifically, the common terminal 421 is coupled to the filter 72. The common terminal 421 is electrically coupled to the antenna terminal 12 via the filter 72. The selection terminals 422 are in one-to-one correspondence with the transmit filters 3. Each selection terminal 422 is coupled to an output end of the corresponding transmit filter 3.

The second switch 42 can connect, for example, at least one of the selection terminals 422 to the common terminal 421. The second switch 42 may be, for example, a switch IC. The second switch 42 is controlled by, for example, the signal processing circuit 92 (refer to FIG. 2). In accordance with a control signal from the RF signal processing circuit 94 (refer to FIG. 2) of the signal processing circuit 92, the second switch 42 switches connections between the common terminal 421 and the selection terminals 422. The second switch 42 may simultaneously couple a plurality of the selection terminals 422 to the common terminal 421. In this case, the second switch 42 is a so-called direct mapping switch, which can establish connection between one terminal and a plurality of terminals.

(3.5) First Matching Network

As illustrated in FIG. 1, the first matching networks 5 are coupled between the transmit filters 3 and the first switch 41. Specifically, the first matching networks 5 are coupled between input ends of the transmit filters 3 and the selection terminals 412 of the first switch 41; in other words, the first matching networks 5 are provided between the transmit filters 3 and the first switch 41 in the transmit path T1 for radio-frequency signal. Each first matching network 5 is coupled on the input side with respect to the corresponding transmit filter 3, and provides impedance matching between the output impedance of the circuit on the first switch 41 side and the input impedance of the transmit filter 3. Each first matching network 5 may be formed by, for example, at least one of an inductor and a capacitor.

(3.6) Second Matching Network

As illustrated in FIG. 1, the second matching network 6 is coupled between the power amplifier 2 and the first switch 41. Specifically, the second matching network 6 is coupled between an output end 28 of the power amplifier 2 and the common terminal 411 of the first switch 41; in other words, the second matching network 6 is provided between the power amplifier 2 and the first switch 41 in the transmit path T1. The second matching network 6 includes a transmission line transformer (TLT) 61.

The transmission line transformer 61 includes two first windings 62 and a second winding 63. The two first windings 62 are coupled between the power amplifier 2 and the first switch 41. The second winding 63 is coupled between the power amplifier 2 and the ground. Specifically, the two first windings 62 are coupled between the output end 28 of the power amplifier 2 and the common terminal 411 of the first switch 41. The second winding 63 is coupled between the output end 28 of the power amplifier 2 and the ground.

The two first windings 62 include a first winding 621 and a first winding 622. The two first windings 62 are coupled in series with each other between the power amplifier 2 and the first switch 41. Specifically, the two first windings 62 are coupled in series with each other between the output end 28 of the power amplifier 2 and the common terminal 411 of the first switch 41.

The second winding 63 is disposed adjacent to the first windings 62 with respect to a first direction D1. Specifically, the second winding 63 is disposed between the first winding 621 and the first winding 622 with respect to the first direction D1.

The direction of current flow in the first winding 621 is the same as the direction of current flow in the first winding 622 (refer to arrows in FIG. 1). By contrast, the direction of current flow in the second winding 63 is opposite to the direction of current flow in the first windings 62 with respect to a second direction D2 (refer to arrows in FIG. 1). The second direction D2 is perpendicular to the first direction D1. In the example in FIG. 1, the current flows in the first windings 62 from left to right. In contrast, the current flows in the second winding 63 from right to left.

Incidentally, because the transmission line transformer 61 is used as the second matching network 6, it may be difficult to reduce harmonic components in the second matching network 6.

However, the first matching networks 5 each has a function of reducing harmonic components of the radio-frequency signal from the power amplifier 2. The first matching networks 5 may reduce, for example, a second harmonic wave and a third harmonic wave. As a result, when it is difficult for the transmission line transformer 61 to reduce harmonic components, the first matching networks 5 can reduce the harmonic components, and thus, a radio-frequency signal with a reduced harmonic component can be inputted to the transmit filters 3.

(3.7) Filter

The filter 71 illustrated in FIG. 1 has a function of reducing harmonic components of the radio-frequency signal from the power amplifier 2. The filter 71 may reduce, for example, a second harmonic wave and a third harmonic wave; in other words, the filter 71 is coupled to the selection terminal 413 of the first switch 41 and reduces harmonic components of radio-frequency signal. As a result, when it is difficult for the transmission line transformer 61 to reduce harmonic components, the filter 71 can reduce the harmonic components.

As illustrated in FIG. 1, the filter 72 is coupled between the second switch 42 and the antenna terminal 12; in other words, the filter 72 is provided between the second switch 42 and the antenna terminal 12 in the transmit path T1.

(3.8) Antenna Terminal

The antenna terminal 12 illustrated in FIG. 1 is a terminal to which the antenna 91 (refer to FIG. 2) is coupled. A radio-frequency signal from the radio-frequency circuit 1 is outputted through the antenna terminal 12 to the antenna 91; by contrast, a radio-frequency signal from the antenna 91 is outputted through the antenna terminal 12 to the radio-frequency circuit 1. This means that a transmit signal from the radio-frequency circuit 1 is outputted through the antenna terminal 12 to the antenna 91; by contrast, a receive signal from the antenna 91 is inputted through the antenna terminal 12 to the radio-frequency circuit 1.

(4) Operation of Radio-Frequency Circuit

The following describes an operation of the radio-frequency circuit 1 according to the first embodiment with reference to drawings.

Firstly, as illustrated in FIG. 1, a radio-frequency signal entering the radio-frequency circuit 1 is inputted to the power amplifier 2. The power amplifier 2 amplifies the radio-frequency signal and outputs the amplified radio-frequency signal. The radio-frequency signal outputted from the power amplifier 2 is transferred through the second matching network 6, the first switch 41, and the first matching network 5, and inputted to the transmit filter 3. The radio-frequency signal is passed through the transmit filter 3, and outputted to the antenna 91 (refer to FIG. 2) via the antenna terminal 12.

Figure 3A:
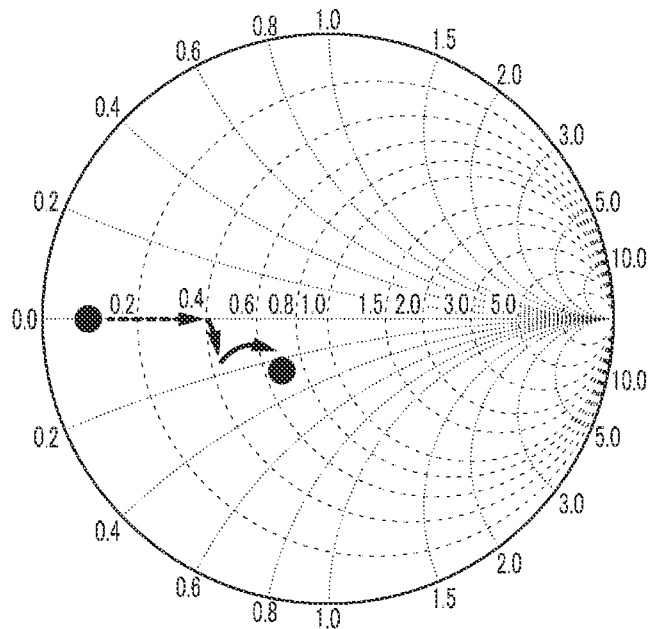
FIG. 3A is a Smith chart illustrating impedance matching with the radio-frequency circuit according to the embodiment.

In the radio-frequency circuit 1, as illustrated in FIG. 3A, the second matching network 6 (the transmission line transformer 61) transforms the output impedance of the power amplifier 2 (a dotted arrow in FIG. 3A). Subsequently, the first matching network 5 provides impedance matching with the input impedance of the transmit filter 3 (the duplexer 32) (solid arrows in FIG. 3A).

For example, when the output impedance of the power amplifier 2 is in the range of 1 to 10Ω, the second matching network 6 (the transmission line transformer 61) transforms the impedance to the range of 20 to 50Ω, and the first matching network 5 further transforms the impedance to match the input impedance of the transmit filter 3.

Figure 3B:
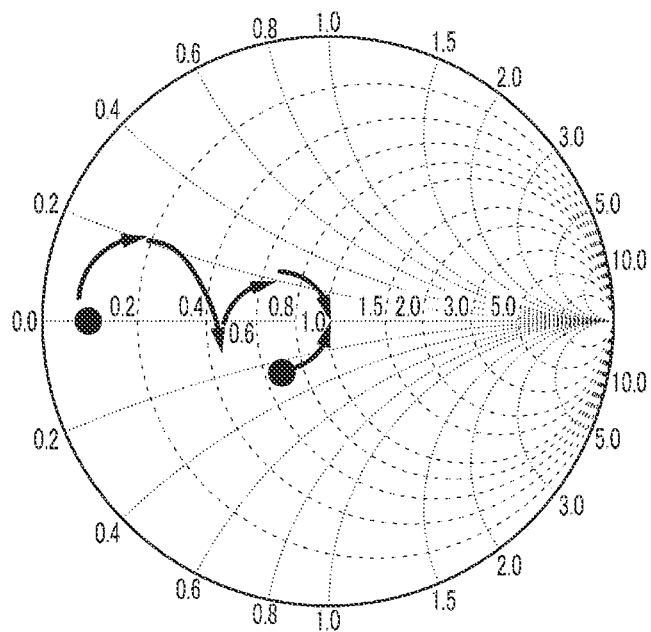
FIG. 3B is a Smith chart illustrating impedance matching with a radio-frequency circuit according to a comparative example.

When the second matching network includes only an inductor and a capacitor instead of a transmission line transformer, as illustrated in FIG. 3B, the second matching network changes the output impedance of the power amplifier (an arrow in FIG. 3B). Subsequently, the first matching network changes the impedance to 50Ω. Additionally, the input impedance of the transmit filter is adjusted to reach 50Ω. As such, 50Ω impedance matching is achieved.

(5) Structure of Radio-Frequency Circuit

The following describes a structure of the radio-frequency circuit 1 according to the first embodiment with reference to a drawing.

Figure 4:
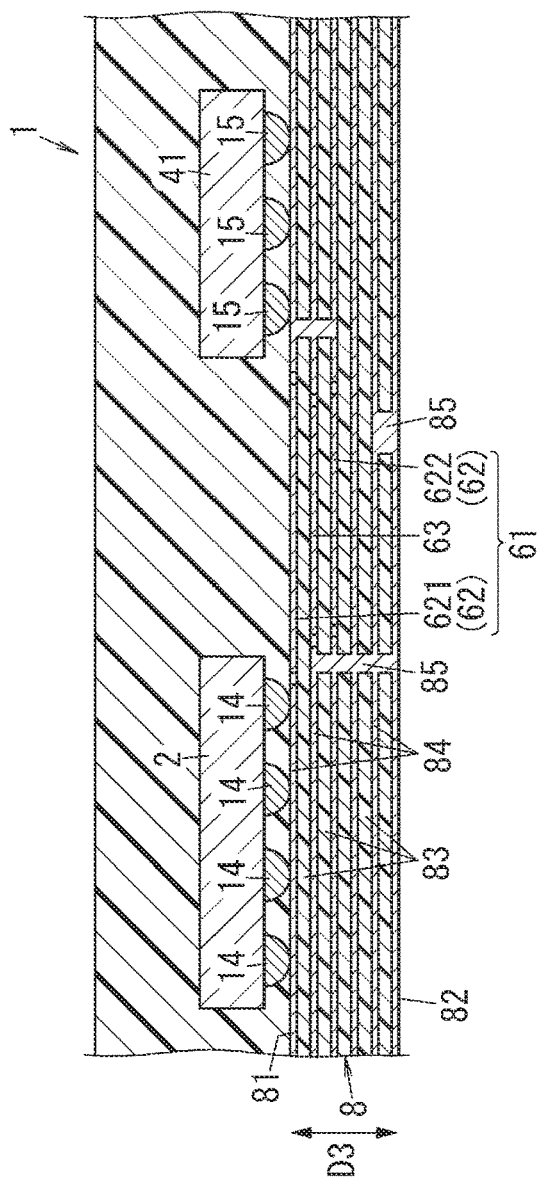
FIG. 4 is a sectional view of the radio-frequency circuit according to the embodiment.

As illustrated in FIG. 4, the radio-frequency circuit 1 includes a mounting board 8 and a plurality of circuit elements. As the circuit elements, the radio-frequency circuit 1 includes the power amplifier 2, the transmit filters 3, the first switch 41, the second switch 42, the first matching networks 5, the second matching network 6 (the transmission line transformer 61), and the filters 71 and 72. Of the circuit elements, FIG. 4 illustrates the power amplifier 2, the transmission line transformer 61, and the first switch 41.

The radio-frequency circuit 1 can be electrically coupled to an external substrate (not illustrated in the drawing). The external substrate may be, for example, a mother substrate of a device such as a mobile phone or communication device. Here, the condition that the radio-frequency circuit 1 can be electrically coupled to the external substrate includes, in addition to the case in which the radio-frequency circuit 1 is directly mounted on the external substrate, the case in which the radio-frequency circuit 1 is indirectly mounted on the external substrate. The case in which the radio-frequency circuit 1 is indirectly mounted on the external substrate includes, for example, the case in which the radio-frequency circuit 1 is mounted on another radio-frequency circuit (another radio-frequency module) mounted on the external substrate.

(5.1) Mounting Board

As illustrated in FIG. 4, the mounting board 8 has a first major surface 81 and a second major surface 82. The first major surface 81 and the second major surface 82 are opposite to each other with respect to a thickness direction D3 of the mounting board 8. When the radio-frequency circuit 1 is mounted on the external substrate (not illustrated in the drawing), the second major surface 82 may face the external substrate.

The mounting board 8 is a multilayer substrate formed by stacking a plurality of dielectric layers 83. The mounting board 8 includes a plurality of conductor patterns 84 and a plurality of columnar electrodes 85. The conductor patterns 84 includes a conductor pattern set to a ground potential. The columnar electrodes 85 electrically couple the circuit elements mounted on the first major surface 81 to the conductor patterns 84 in the mounting board 8. The columnar electrodes 85 also electrically couple the circuit elements mounted on the first major surface 81 and the conductor patterns 84 in the mounting board 8 to an external connection terminal (not illustrated in the drawing).

(5.2) Power Amplifier

As illustrated in FIG. 4, the power amplifier 2 is mounted on the mounting board 8. In the example in FIG. 4, the power amplifier 2 is a chip element; the power amplifier 2 is mounted on the first major surface 81 of the mounting board 8. The power amplifier 2 is coupled to the conductor pattern 84 at the first major surface 81 of the mounting board 8 with a plurality of bumps 14. Alternatively, a portion of the power amplifier 2 may be disposed at the first major surface 81 of the mounting board 8, while the remainder of the power amplifier 2 may be disposed inside the mounting board 8. This means that the power amplifier 2 is disposed closer to the first major surface 81 than to the second major surface 82 in the mounting board 8.

(5.3) First Switch

As illustrated in FIG. 4, the first switch 41 is mounted on the mounting board 8. In the example in FIG. 4, the first switch 41 is a chip element; the first switch 41 is mounted on the first major surface 81 of the mounting board 8. The first switch 41 is coupled to the conductor pattern 84 at the first major surface 81 of the mounting board 8 with a plurality of bumps 15. Alternatively, a portion of the first switch 41 may be disposed at the first major surface 81 of the mounting board 8, while the remainder of the first switch 41 may be disposed inside the mounting board 8. This means that the first switch 41 is disposed closer to the first major surface 81 than to the second major surface 82 in the mounting board 8.

(5.4) Transmission Line Transformer

As illustrated in FIG. 4, the transmission line transformer 61 of the second matching network 6 is disposed in the mounting board 8. In the first embodiment, the transmission line transformer 61 is formed by conductors disposed in the mounting board 8. Specifically, the first winding 621 is provided at the first major surface 81 of the mounting board 8. The first winding 622 and the second winding 63 are disposed inside the mounting board 8. In the thickness direction D3 of the mounting board 8, the first winding 621, the second winding 63, and the first winding 622 are disposed in the order presented. As such, the transmission line transformer 61 can be easily formed.

The first winding 621 may be formed as, for example, a planar winding at the first major surface 81 of the mounting board 8. By contrast, the first winding 622 may be formed as, for example, a planar winding in the mounting board 8. The second winding 63 may be formed as, for example, a planar winding in the mounting board 8.

In the mounting board 8, the transmission line transformer 61 is disposed between the power amplifier 2 and the first switch 41. When viewed in plan view in the thickness direction D3 of the mounting board 8, the transmission line transformer 61 is disposed between the power amplifier 2 and the first switch 41. This structure can shorten the interconnection between the transmission line transformer 61 and the power amplifier 2 and the interconnection between the transmission line transformer 61 and the first switch 41.

(6) Effects

In the radio-frequency circuit 1 according to the first embodiment, the first switch 41 and the first matching networks 5 are provided between the power amplifier 2 and the transmit filters 3 in the transmit path T1 of radio-frequency signal, and additionally, the second matching network 6 including the transmission line transformer 61 is provided between the power amplifier 2 and the first switch 41. This configuration facilitates the impedance matching between the power amplifier 2 and the transmit filters 3.

In the radio-frequency circuit 1 according to the first embodiment, the first matching networks 5 reduce harmonic components of the radio-frequency signal from the power amplifier 2. As a result, when it is difficult for the transmission line transformer 61 to reduce harmonic components, the first matching networks 5 can reduce the harmonic components, and thus, a radio-frequency signal with a reduced harmonic component can be inputted to the transmit filters 3.

In the radio-frequency circuit 1 according to the first embodiment, the transmission line transformer 61 is disposed in the mounting board 8. As a result, the transmission line transformer 61 can be easily formed.

In the radio-frequency circuit 1 according to the first embodiment, the transmission line transformer 61 is disposed between the power amplifier 2 and the first switch 41 in the mounting board 8. This structure can shorten the interconnection between the transmission line transformer 61 and the power amplifier 2 and the interconnection between the transmission line transformer 61 and the first switch 41.

(7) Modification

The following describes a modification of the first embodiment.

Figure 5:
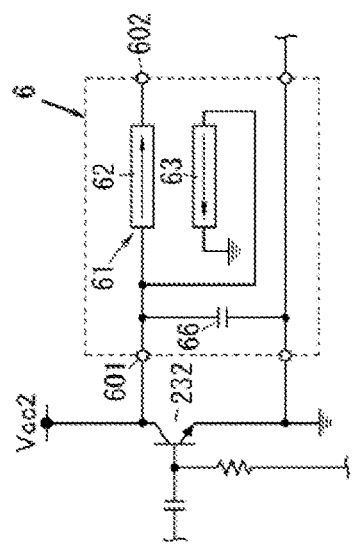
FIG. 5 is a circuit diagram of a second matching network of a radio-frequency circuit according to a modification of the first embodiment.

As a modification of the first embodiment, the radio-frequency circuit 1 may include the second matching network 6 illustrated in FIG. 5. The second matching network 6 of this modification includes the transmission line transformer 61 and a capacitor 66. The capacitor 66 is coupled between an input end 601 of the second matching network 6 and the ground. The transmission line transformer 61 is provided between the input end 601 and the output end 602.

The radio-frequency circuit 1 according to the modification described above can also achieve the same effects as the radio-frequency circuit 1 according to the first embodiment.

Second Embodiment

Figure 6:
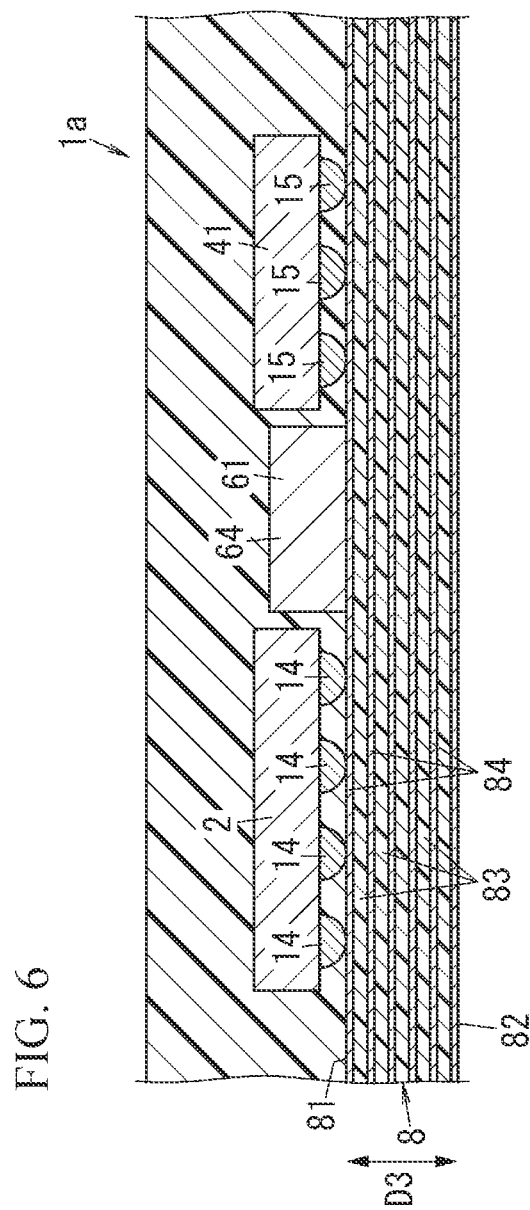
FIG. 6 is a sectional view of a radio-frequency circuit according to a second embodiment.

A radio-frequency circuit 1a according to a second embodiment differs from the radio-frequency circuit 1 according to the first embodiment (refer to FIG. 4) in having a structure as illustrated in FIG. 6. Regarding the radio-frequency circuit 1a according to the second embodiment, substantially the same constituent elements as the radio-frequency circuit 1 according to the first embodiment are assigned the same reference characters, and descriptions thereof are not repeated.

(1) Structure

As illustrated in FIG. 6, in the radio-frequency circuit 1a according to the second embodiment, the transmission line transformer 61 is formed by a single chip 64. The chip 64 of the second embodiment may be, for example, an intelligent power device (IPD). As a result, the transmission line transformer 61 can be formed separately from other circuit elements. Regarding the transmission line transformer 61 of the second embodiment, descriptions of the same configuration and function as the transmission line transformer 61 (refer to FIGS. 1 and 4) of the first embodiment are not repeated.

The chip 64 of the second embodiment is mounted on the mounting board 8. The chip 64 of the second embodiment is disposed between the power amplifier 2 and the first switch 41 on the mounting board 8. When viewed in plan view in the thickness direction D3 of the mounting board 8, the transmission line transformer 61 is disposed between the power amplifier 2 and the first switch 41. This structure can shorten the interconnection between the transmission line transformer 61 and the power amplifier 2 and the interconnection between the transmission line transformer 61 and the first switch 41.

(2) Effects

In the radio-frequency circuit 1a according to the second embodiment, the transmission line transformer 61 is formed by the single chip 64 and mounted on the mounting board 8. As a result, the transmission line transformer 61 can be formed separately from other circuit elements.

In the radio-frequency circuit 1a according to the second embodiment, the transmission line transformer 61 is disposed between the power amplifier 2 and the first switch 41 on the mounting board 8. Similarly to the first embodiment, this structure can shorten the interconnection between the transmission line transformer 61 and the power amplifier 2 and the interconnection between the transmission line transformer 61 and the first switch 41.

Third Embodiment

Figure 7:
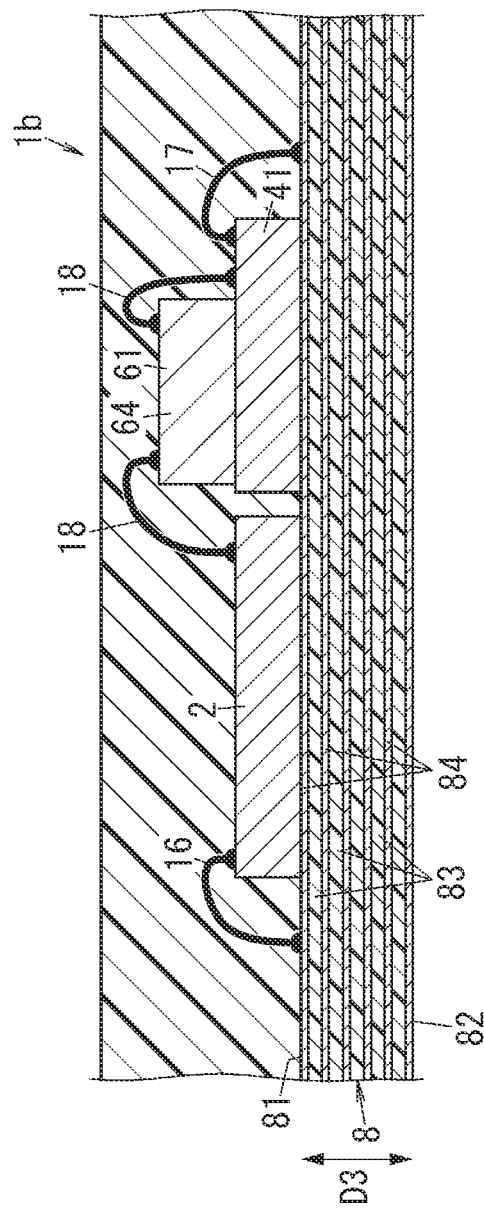
FIG. 7 is a sectional view of a radio-frequency circuit according to a third embodiment.

A radio-frequency circuit 1b according to a third embodiment differs from the radio-frequency circuit 1 according to the first embodiment (refer to FIG. 4) in having a structure as illustrated in FIG. 7. Regarding the radio-frequency circuit 1b according to the third embodiment, substantially the same constituent elements as the radio-frequency circuit 1 according to the first embodiment are assigned the same reference characters, and descriptions thereof are not repeated.

(1) Structure

As illustrated in FIG. 7, in the radio-frequency circuit 1b according to the third embodiment, the power amplifier 2 and the first switch 41 are mounted on the mounting board 8. The power amplifier 2 is coupled to the conductor pattern 84 at the first major surface 81 of the mounting board 8 by wire bonding using wires 16. The first switch 41 is coupled to the conductor pattern 84 at the first major surface 81 of the mounting board 8 by wire bonding using wires 17.

The transmission line transformer 61 is formed by the single chip 64. Regarding the transmission line transformer 61 of the third embodiment, descriptions of the same configuration and function as the transmission line transformer 61 (refer to FIGS. 1 and 4) of the first embodiment are not repeated.

The chip 64 of the third embodiment is stacked on the first switch 41. The chip 64 is electrically coupled to the power amplifier 2 and the first switch 41 by wire bonding using wires 18. This structure eliminates the need for a space for the transmission line transformer 61 in the mounting board 8, and thus, the size can be reduced.

(2) Effects

In the radio-frequency circuit 1b according to the third embodiment, the transmission line transformer 61 is stacked on the first switch 41. This structure eliminates the need for a space for the transmission line transformer 61 in the mounting board 8, and thus, the size can be reduced.

Fourth Embodiment

Figure 8:
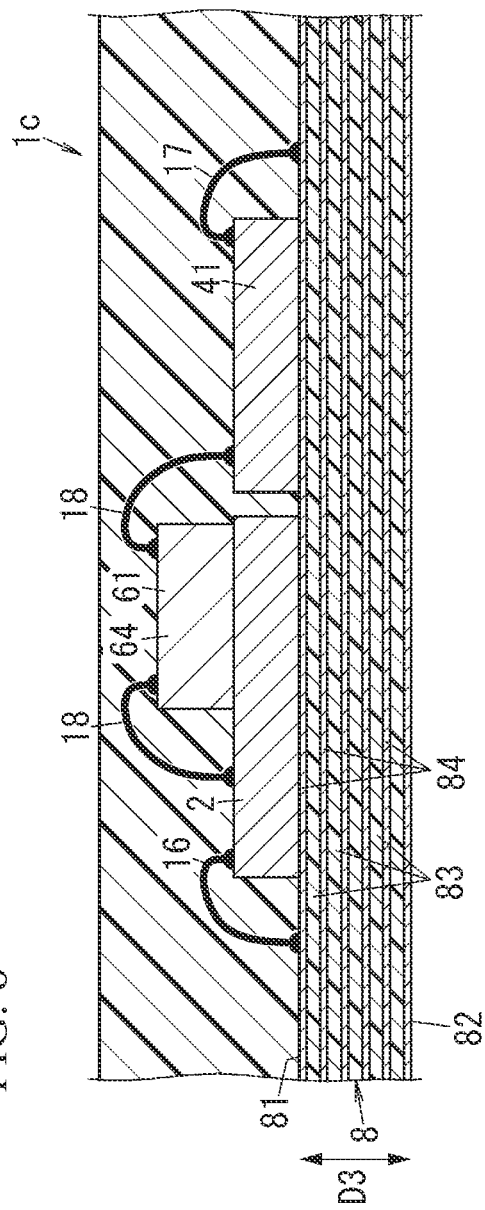
FIG. 8 is a sectional view of a radio-frequency circuit according to a fourth embodiment.

A radio-frequency circuit 1c according to a fourth embodiment differs from the radio-frequency circuit 1 according to the first embodiment (refer to FIG. 4) in having a structure as illustrated in FIG. 8. Regarding the radio-frequency circuit 1c according to the fourth embodiment, substantially the same constituent elements as the radio-frequency circuit 1 according to the first embodiment are assigned the same reference characters, and descriptions thereof are not repeated.

(1) Structure

As illustrated in FIG. 8, in the radio-frequency circuit 1c according to the fourth embodiment, the power amplifier 2 and the first switch 41 are mounted on the mounting board 8. Similarly to the power amplifier 2 and the first switch 41 (refer to FIG. 7) of the third embodiment, the power amplifier 2 and the first switch 41 of the fourth embodiment are coupled to the conductor pattern 84 at the first major surface 81 of the mounting board 8 by wire bonding.

The transmission line transformer 61 is formed by the single chip 64. Regarding the transmission line transformer 61 of the fourth embodiment, descriptions of the same configuration and function as the transmission line transformer 61 (refer to FIGS. 1 and 4) of the first embodiment are not repeated.

The chip 64 of the fourth embodiment is stacked on the power amplifier 2. The chip 64 is electrically coupled to the power amplifier 2 and the first switch 41 by wire bonding using the wires 18. This structure eliminates the need for a space for the transmission line transformer 61 in the mounting board 8, and thus, the size can be reduced.

(2) Effects

In the radio-frequency circuit 1c according to the fourth embodiment, the transmission line transformer 61 is stacked on the power amplifier 2. This structure eliminates the need for a space for the transmission line transformer 61 in the mounting board 8, and thus, the size can be reduced.

Fifth Embodiment

Figure 9:
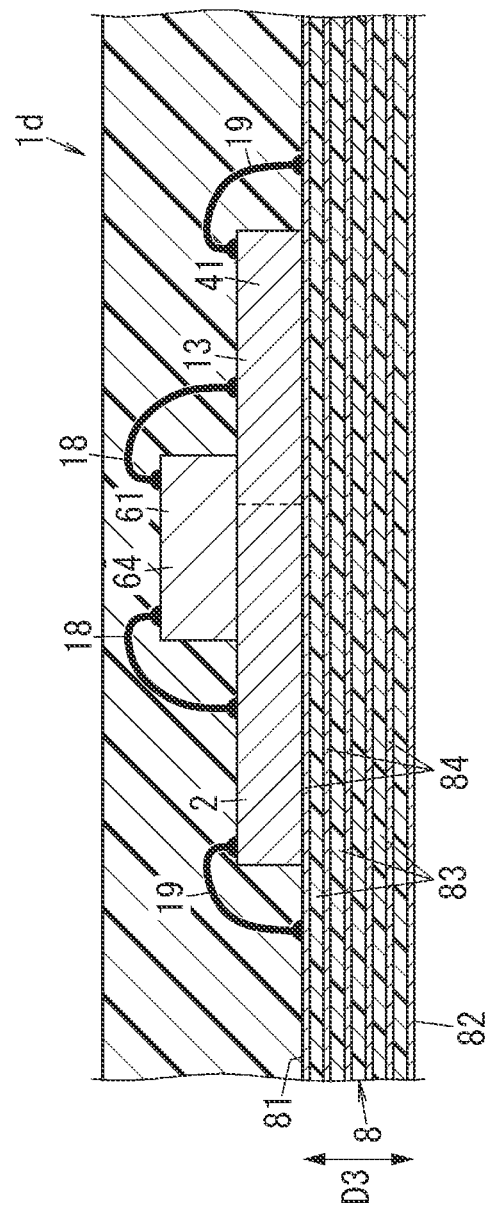
FIG. 9 is a sectional view of a radio-frequency circuit according to a fifth embodiment.

A radio-frequency circuit 1d according to a fifth embodiment differs from the radio-frequency circuit 1 according to the first embodiment (refer to FIG. 4) in having a structure as illustrated in FIG. 9. Regarding the radio-frequency circuit 1d according to the fifth embodiment, substantially the same constituent elements as the radio-frequency circuit 1 according to the first embodiment are assigned the same reference characters, and descriptions thereof are not repeated.

(1) Structure

As illustrated in FIG. 9, in the radio-frequency circuit 1d according to the fifth embodiment, the power amplifier 2 and the first switch 41 are formed by a single chip 13. The chip 13 is coupled to the conductor pattern 84 at the first major surface 81 of the mounting board 8 by wire bonding using wires 19.

The transmission line transformer 61 is formed by the single chip 64. Regarding the transmission line transformer 61 of the fifth embodiment, descriptions of the same configuration and function as the transmission line transformer 61 (refer to FIGS. 1 and 4) of the first embodiment are not repeated.

The chip 64 of the fifth embodiment is stacked on the chip 13. The chip 64 is electrically coupled to the chip 13 by wire bonding using the wires 18; in other words, the chip 64 is electrically coupled to the power amplifier 2 and the first switch 41 by wire bonding.

(2) Effects

In the radio-frequency circuit 1d according to the fifth embodiment, the transmission line transformer 61 is stacked on the single chip 13 forming the power amplifier 2 and the first switch 41. This structure eliminates the need for a space for the transmission line transformer 61 in the mounting board 8, and thus, the size can be reduced.

Sixth Embodiment

Figure 10:
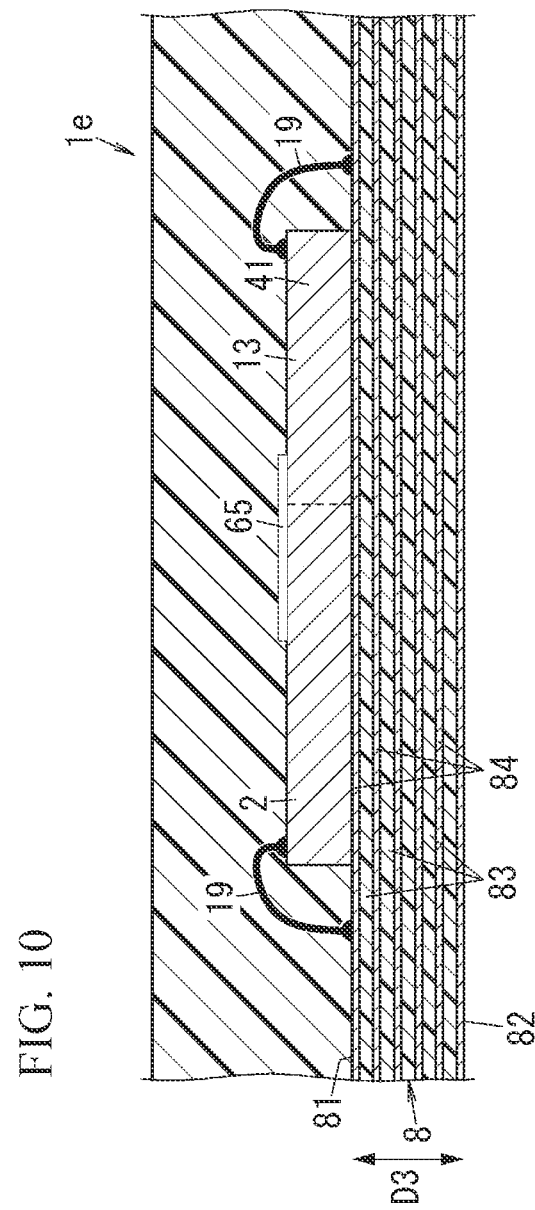
FIG. 10 is a sectional view of a radio-frequency circuit according to a sixth embodiment.

A radio-frequency circuit 1e according to a sixth embodiment differs from the radio-frequency circuit 1 according to the first embodiment (refer to FIG. 4) in having a structure as illustrated in FIG. 10. Regarding the radio-frequency circuit 1e according to the sixth embodiment, substantially the same constituent elements as the radio-frequency circuit 1 according to the first embodiment are assigned the same reference characters, and descriptions thereof are not repeated.

(1) Structure

As illustrated in FIG. 10, in the radio-frequency circuit 1e according to the sixth embodiment, the power amplifier 2 and the first switch 41 are formed by the single chip 13. In the sixth embodiment, the chip 13 including the power amplifier 2 and the first switch 41 is coupled to the conductor pattern 84 at the first major surface 81 of the mounting board 8 by wire bonding using the wires 19.

The transmission line transformer 61 is formed by a conductor 65 disposed on the chip 13; in other words, the transmission line transformer 61 is formed by the conductor 65 disposed on the power amplifier 2 and the first switch 41.

Regarding the transmission line transformer 61 of the sixth embodiment, descriptions of the same configuration and function as the transmission line transformer 61 (refer to FIG. 4) of the first embodiment are not repeated.

(2) Effects

In the radio-frequency circuit 1e according to the sixth embodiment, the transmission line transformer 61 is formed by the conductor 65 disposed on the power amplifier 2 and the first switch 41. This structure eliminates the need for a space for the transmission line transformer 61 in the mounting board 8, thereby reducing the size.

(3) Modifications

In the radio-frequency circuit 1e, the chip 13 including the power amplifier 2 and the first switch 41 is not necessarily coupled to the mounting board 8 by wire bonding using the wire 19. As a first modification of the sixth embodiment, the chip 13 including the power amplifier 2 and the first switch 41 may be coupled to the mounting board 8 by bumps.

As a second modification of the sixth embodiment, the power amplifier 2 and the first switch 41 may be formed as individual devices in the radio-frequency circuit 1e. In this case, the conductor 65 forming the transmission line transformer 61 may be disposed on the power amplifier 2. Alternatively, the conductor 65 forming the transmission line transformer 61 may be disposed on the first switch 41. This means that the conductor 65 forming the transmission line transformer 61 is disposed on at least one of the power amplifier 2 and the first switch 41. Similarly to the first modification, also in the second modification, the power amplifier 2 is not necessarily coupled to the mounting board 8 by wire bonding, and the power amplifier 2 may be coupled to the mounting board 8 by bumps. Similarly to the first modification, also in the second modification, the first switch 41 is not necessarily coupled to the mounting board 8 by wire bonding, and the first switch 41 may be coupled to the mounting board 8 by bumps.

The radio-frequency circuit 1e according to the modifications described above can also achieve the same effects as the radio-frequency circuit 1e according to the sixth embodiment.

The embodiments and modifications described above are mere examples of various embodiments and modifications according to the present disclosure. Various changes to the embodiments and modifications may be made based on design of the present disclosure.

Aspects

This specification discloses the following aspects.

A radio-frequency circuit (1; 1a; 1b; 1c; 1d; 1e) according to a first aspect includes a power amplifier (2), a plurality of transmit filters (3), a switch (the first switch 41), a plurality of first matching networks (5), and a second matching network (6). The switch switches the plurality of transmit filters (3) to be coupled to the power amplifier (2). The plurality of first matching networks (5) are coupled between the plurality of transmit filters (3) and the switch. The second matching network (6) is coupled between the power amplifier (2) and the switch. The second matching network (6) includes a transmission line transformer (61).

With the radio-frequency circuit (1; 1a; 1b; 1c; 1d; 1e) according to the first aspect, impedance can be easily matched between the power amplifier (2) and the plurality of transmit filters (3).

In the radio-frequency circuit (1; 1a; 1b; 1c; 1d; 1e) according to a second aspect, with respect to the first aspect, the transmission line transformer (61) includes at least one first winding (62) and a second winding (63). The first winding (62) is coupled between the power amplifier (2) and the switch (the first switch 41). The second winding (63) is coupled between the power amplifier (2) and the ground. The second winding (63) is disposed adjacent to the first winding (62) with respect to a first direction (D1). The direction of current flow in the second winding (63) is opposite to the direction of current flow in the first winding (62) with respect to a second direction (D2) perpendicular to the first direction (D1).

In the radio-frequency circuit (1; 1a; 1b; 1c; 1d; 1e) according to a third aspect, with respect to the second aspect, the transmission line transformer (61) includes two first windings (62). The two first windings (62) are coupled in series with each other between the power amplifier (2) and the switch (the first switch 41). The two first windings (62) are identical to each other with respect to the direction of current flow. The second winding (63) is disposed between the two first windings (62) with respect to the first direction (D1).

In the radio-frequency circuit (1; 1a; 1b; 1c; 1d; 1e) according to a fourth aspect, with respect to any one of the first to third aspects, the plurality of first matching networks (5) are each configured to reduce a harmonic component of a radio-frequency signal from the power amplifier (2).

With the radio-frequency circuit (1; 1a; 1b; 1c; 1d; 1e) according to the fourth aspect, when it is difficult for the transmission line transformer (61) to reduce harmonic components, the first matching networks (5) can reduce the harmonic components, and thus, a radio-frequency signal with a reduced harmonic component can be inputted to the transmit filters (3).

The radio-frequency circuit (1) according to a fifth aspect, with respect to any one of the first to fourth aspects, further includes a mounting board (8). The transmission line transformer 61 is formed by a conductor disposed at the mounting board (8).

According to the radio-frequency circuit (1) of the fifth aspect, the transmission line transformer (61) can be easily formed.

The radio-frequency circuit (1a; 1b; 1c; 1d) according to a sixth aspect, with respect to any one of the first to fourth aspects, further includes a mounting board (8). The transmission line transformer (61) is formed by a single chip (64) and mounted at the mounting board (8).

According to the radio-frequency circuit (1a; 1b; 1c; 1d) of the sixth aspect, the transmission line transformer (61) can be formed separately from other circuit elements.

In the radio-frequency circuit (1; 1a) according to a seventh aspect, with respect to the fifth or sixth aspect, the transmission line transformer (61) is disposed between the power amplifier (2) and the switch (the first switch 41) at the mounting board (8).

According to the radio-frequency circuit (1; 1a) of the seventh aspect, it is possible to shorten the interconnection between the transmission line transformer (61) and the power amplifier (2) and the interconnection between the transmission line transformer (61) and the switch (the first switch 41).

In the radio-frequency circuit (1b; 1c) according to an eighth aspect, with respect to the sixth aspect, a circuit component forming the power amplifier (2) or the switch (the first switch 41) is mounted on the mounting board (8). The transmission line transformer (61) is stacked on the circuit component.

According to the radio-frequency circuit (1b; 1c) of the eighth aspect, this structure eliminates the need for a space for the transmission line transformer (61) at the mounting board (8), and thus, the size can be reduced.

In the radio-frequency circuit (1d) according to a ninth aspect, with respect to the sixth aspect, the power amplifier (2) and the switch (the first switch 41) are formed together by a single chip (13). The transmission line transformer (61) is stacked on the chip (13).

According to the radio-frequency circuit (1d) of the ninth aspect, this structure eliminates the need for a space for the transmission line transformer (61) at the mounting board (8), and thus, the size can be reduced.

In the radio-frequency circuit (1e) according to a tenth aspect, with respect to any one of the first to fourth aspects, the transmission line transformer (61) is formed by a conductor (65) mounted on at least one of the power amplifier (2) and the switch (the first switch 41).

According to the radio-frequency circuit (1e) of the tenth aspect, this structure eliminates the need for a space for the transmission line transformer (61) at the mounting board (8), and thus, the size can be reduced.

A communication device (9) according to an eleventh aspect includes the radio-frequency circuit (1; 1a; 1b; 1c; 1d; 1e) according to any one of the first to tenth aspects and a signal processing circuit (92). The signal processing circuit (92) processes a radio-frequency signal to be transmitted to the radio-frequency circuit.

According to the communication device (9) of the eleventh aspect, with the radio-frequency circuit (1; 1a; 1b; 1c; 1d; 1e), impedance can be easily matched between the power amplifier (2) and the plurality of transmit filters (3).

REFERENCE SIGNS LIST

1, 1a, 1b, 1c, 1d, 1e radio-frequency circuit
11 input terminal
12 antenna terminal
13 chip
14, 15 bump
16, 17, 18, 19 wire
2 power amplifier
21 transmit circuit
22 control circuit
231, 232 transistor
241, 242 bias circuit
251, 252 resistor
261, 262 capacitor
271, 272 inductor
28 output end
3 transmit filter
31 receive filter
32 duplexer
41 first switch
411 common terminal
412, 413 selection terminal
42 second switch
421 common terminal
422 selection terminal
5 first matching network
6 second matching network
601 input end
602 output end
61 transmission line transformer
62, 621, 622 first winding
63 second winding
64 chip
65 conductor
66 capacitor 71, 72 filter
8 mounting board
81 first major surface
82 second major surface
83 dielectric layer
84 conductor pattern
85 columnar electrode
9 communication device
91 antenna
92 signal processing circuit
93 baseband signal processing circuit
94 RF signal processing circuit
T1 transmit path
Vcc1, Vcc2 supply voltage
D1 first direction
D2 second direction
D3 thickness direction

The invention claimed is:

1. A radio-frequency circuit comprising:
 a power amplifier;
 a plurality of transmit filters;
 a switch configured to selectively couple the plurality of transmit filters to the power amplifier;
 a plurality of first matching networks coupled between the plurality of transmit filters and the switch; and
 a second matching network coupled between the power amplifier and the switch, the second matching network comprising a transmission line transformer.

2. The radio-frequency circuit according to claim 1, wherein:
 the transmission line transformer comprises:
  a first winding coupled between the power amplifier and the switch, and
  a second winding coupled between the power amplifier and ground,
 the second winding is adjacent to the first winding with respect to a first direction, and
 a direction of current flow in the second winding is opposite to a direction of current flow in the first winding with respect to a second direction, the second direction being perpendicular to the first direction.

3. The radio-frequency circuit according to claim 2, comprising two first windings, wherein:
 the two first windings are coupled in series with each other between the power amplifier and the switch,
 the direction of current flow of each of the two first windings are identical to each other, and
 the second winding is between the two first windings with respect to the first direction.

4. The radio-frequency circuit according to claim 3, wherein each of the plurality of first matching networks is configured to reduce a harmonic component of a radio-frequency signal from the power amplifier.

5. The radio-frequency circuit according to claim 3, further comprising:
 a mounting board,
 wherein the transmission line transformer is a conductor that is mounted at the mounting board.

6. The radio-frequency circuit according to claim 3, further comprising:
 a mounting board,
 wherein the transmission line transformer is a single chip that is mounted at the mounting board.

7. The radio-frequency circuit according to claim 2, wherein each of the plurality of first matching networks is configured to reduce a harmonic component of a radio-frequency signal from the power amplifier.

8. The radio-frequency circuit according to claim 2, further comprising:
 a mounting board,
 wherein the transmission line transformer is a conductor that is mounted at the mounting board.

9. The radio-frequency circuit according to claim 2, further comprising:
 a mounting board,
 wherein the transmission line transformer is a single chip that is mounted at the mounting board.

10. The radio-frequency circuit according to claim 1, wherein each of the plurality of first matching networks is configured to reduce a harmonic component of a radio-frequency signal from the power amplifier.

11. The radio-frequency circuit according to claim 10, further comprising:
 a mounting board,
 wherein the transmission line transformer is a conductor that is mounted at the mounting board.

12. The radio-frequency circuit according to claim 10, further comprising:
 a mounting board,
 wherein the transmission line transformer is a single chip that is mounted at the mounting board.

13. The radio-frequency circuit according to claim 1, further comprising:
 a mounting board,
 wherein the transmission line transformer is a conductor that is mounted at the mounting board.

14. The radio-frequency circuit according to claim 13, wherein the transmission line transformer is disposed between the power amplifier and the switch at the mounting board.

15. The radio-frequency circuit according to claim 1, further comprising:
 a mounting board,
 wherein the transmission line transformer is a single chip that is mounted at the mounting board.

16. The radio-frequency circuit according to claim 15, wherein:
 a circuit component of the power amplifier or of the switch is mounted on the mounting board, and
 the transmission line transformer is stacked on the circuit component.

17. The radio-frequency circuit according to claim 15, wherein:
 the power amplifier and the switch are included in a single chip, and
 the transmission line transformer is stacked on the chip.

18. The radio-frequency circuit according to claim 15, wherein the transmission line transformer is between the power amplifier and the switch at the mounting board.

19. The radio-frequency circuit according to claim 1, wherein the transmission line transformer is a conductor that is mounted on the power amplifier or the switch.

20. A communication device comprising:
 the radio-frequency circuit according to claim 1; and
 a signal processing circuit configured to process a radio-frequency signal that is transferred to the radio-frequency circuit.

* * * * *